United States Patent [19]
Durham et al.

[11] Patent Number: 6,115,789
[45] Date of Patent: Sep. 5, 2000

[54] METHOD AND SYSTEM FOR DETERMINING WHICH MEMORY LOCATIONS HAVE BEEN ACCESSED IN A SELF TIMED CACHE ARCHITECTURE

[75] Inventors: Christopher McCall Durham; Hieu Trong Ngo; Peter Juergen Klim, all of Austin, Tex.

[73] Assignee: International Business Machines Corporation, Armonk, N.Y.

[21] Appl. No.: 08/845,868

[22] Filed: Apr. 28, 1997

[51] Int. Cl.[7] .............................. G06F 12/00; G11C 29/00
[52] U.S. Cl. .......................... 711/118; 714/726; 714/719; 714/733; 711/108
[58] Field of Search ................................ 711/118, 108, 711/109, 145; 371/20.4, 21.1, 22.31, 22.34, 22.5; 714/718, 719, 726, 733

[56] References Cited

U.S. PATENT DOCUMENTS

| | | |
|---|---|---|
| 4,392,201 | 7/1983 | Brown et al. . |
| 4,575,792 | 3/1986 | Keeley . |
| 4,680,760 | 7/1987 | Giles et al. . |
| 4,686,621 | 8/1987 | Keeley et al. . |
| 4,947,395 | 8/1990 | Bullinger et al. ..................... 371/22.35 |
| 4,991,081 | 2/1991 | Bosshart . |
| 4,996,641 | 2/1991 | Talgam et al. . |
| 5,031,141 | 7/1991 | Guddat et al. ............................. 365/49 |
| 5,165,029 | 11/1992 | Sawai et al. ............................. 711/118 |
| 5,195,096 | 3/1993 | Moore . |
| 5,249,281 | 9/1993 | Fuccio et al. . |
| 5,289,403 | 2/1994 | Yetter ....................................... 365/49 |
| 5,325,367 | 6/1994 | Dekker et al. .......................... 714/718 |
| 5,394,403 | 2/1995 | Klein ...................................... 714/718 |
| 5,535,164 | 7/1996 | Adams et al. ........................... 365/201 |
| 5,537,572 | 7/1996 | Michelsen et al. . |
| 5,544,342 | 8/1996 | Dean ...................................... 711/119 |
| 5,550,974 | 8/1996 | Pennington et al. ............... 395/183.18 |
| 5,563,833 | 10/1996 | Adams et al. ........................... 365/201 |
| 5,572,707 | 11/1996 | Rozman et al. . |
| 5,614,838 | 3/1997 | Jaber et al. ............................. 324/765 |
| 5,651,013 | 7/1997 | Iadanza .................................. 371/22.3 |
| 5,708,624 | 1/1998 | Leung .................................... 365/233 |
| 5,793,941 | 8/1998 | Pencis et al. ............................... 714/5 |
| 5,802,070 | 9/1998 | Adams et al. .......................... 714/718 |
| 5,905,680 | 5/1999 | Bosshart ............................ 365/189.07 |

OTHER PUBLICATIONS

Zhong J. Deng, Nobuyuki Yoshikawa, Stephen R. Whiteley, and Theodore Van Duzer, University of California, IEEE Trans., Data Driven Self–Timed RSFQ Digital Integrated Circuit and System, pp. 3634–3637, Jun. 1997.

E. Brunvand, University of Utah, IEEE Trans., The NSR Processor, pp. 428–435, 1993.

*Primary Examiner*—John W. Cabeca
*Assistant Examiner*—Pierre-Michel Bataille
*Attorney, Agent, or Firm*—Sawyer Law Group LLP; Anthony V.S. England

[57] ABSTRACT

The present invention provides a method and system for providing observability of memory address access for self-timed cache designs. A system according to the present invention for determining which memory location has been accessed in a self-timed cache comprises a content addressable memory; a secondary memory coupled to the content addressable memory, wherein the secondary memory includes at least one memory location which may be selected by the content addressable memory based upon a self-timed cache access. The system further includes a test circuitry coupled to the content addressable memory, wherein the test circuitry stores a pointer which points to a selected memory location in response to the self-timed cache access of the secondary memory.

15 Claims, 5 Drawing Sheets

METHOD AND SYSTEM FOR DETERMINING WHICH MEMORY LOCATIONS HAVE BEEN ACCESSED IN A SELF TIMED CACHE ARCHITECTURE

FIELD OF THE INVENTION

The present invention relates generally to self timed cache architecture, and more particularly, to a system and method for determining which main memory array location has been accessed in a self-timed cache.

BACKGROUND OF THE INVENTION

Self-timed circuit techniques have long been used in memory designs, finding their way into both static and dynamic random access memories (RAMs) and the more complex content addressable memories (CAMs). Testing memories with these designs, however, can be very difficult as self-timed circuitry tends to provide little insight into internal operation, making observability at the input and output pins only.

In RAMs, the function being performed is simple enough that testability can be secondary priority in the overall design process. That is, the sole function of a simple RAM is to store and retrieve data, and this can be performed with self-timed techniques rather easily. Failures can, thus, be determined readily as the function is not extremely complex.

In CAM architectures, such as those being utilized as caches, the problem is not so simple. In such architectures, arrays of tag bits are compared with an incoming address to check for a match. If such a match occurs, then a secondary memory is accessed to select the desired information. If a match is not found, the information is typically retrieved from the main memory and sent to the requestor as well as being stored in the CAM.

Problems, then, arise in the access of the secondary memory. Since the tag matching function may select any memory location in the secondary memory array, it is typically extremely difficult to determine which location has been selected. This creates a problem in determining which locations in the secondary memory (if any) are failing due to process errors, design problems, etc. Determining which memory location has failed is extremely important as factors in manufacturing, such as in bitmapping the memory array for fault isolation to direct design characterization, design modifications, and repairing with redundant elements.

There are typically two basic types of CAM architecture being utilized as a cache: clocked cache architecture and self-timed cache architecture.

Typically, in a clocked cache architecture, determination of which locations in the secondary memory can be accomplished by channeling signals utilized to select a location in the secondary memory through a set of latches. The set of latches are typically set up to receive and forward the selection signals in a serial fashion to the secondary memory.

In self-timed caches, an operational clock is not available for resetting the set of latches. Therefore, the conventional configuration of CAM, secondary memory and latches is not suitable for a self-timed cache.

Accordingly, what is needed is a method and system for determining which secondary memory array location has been accessed in a self-timed cache. The present invention addresses such a need.

SUMMARY OF THE INVENTION

The present invention provides a method and system for providing observability of memory address access for self-timed cache designs. A system according to the present invention for determining which memory location has been accessed in a self-timed cache comprises a content addressable memory; a secondary memory coupled to the content addressable memory, wherein the secondary memory includes at least one memory location which may be selected by the content addressable memory based upon a self-timed cache access. The system further includes a test circuitry coupled to the content addressable memory, wherein the test circuitry stores a pointer which points to a selected memory location in response to the self-timed cache access.

The present invention has not been found to affect the timing or increase delay of a self-timed cache design. The system and method according to the present invention provides a shadow function to mimic operations in parallel and storing information into a register file. This stored information can then be read out through an LSSD scan mode to determine if there are any faults or defects in the CAM circuitry.

DESCRIPTION OF THE INVENTION

The present invention relates to a method and system for providing observability of memory address access for self-timed cache designs. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
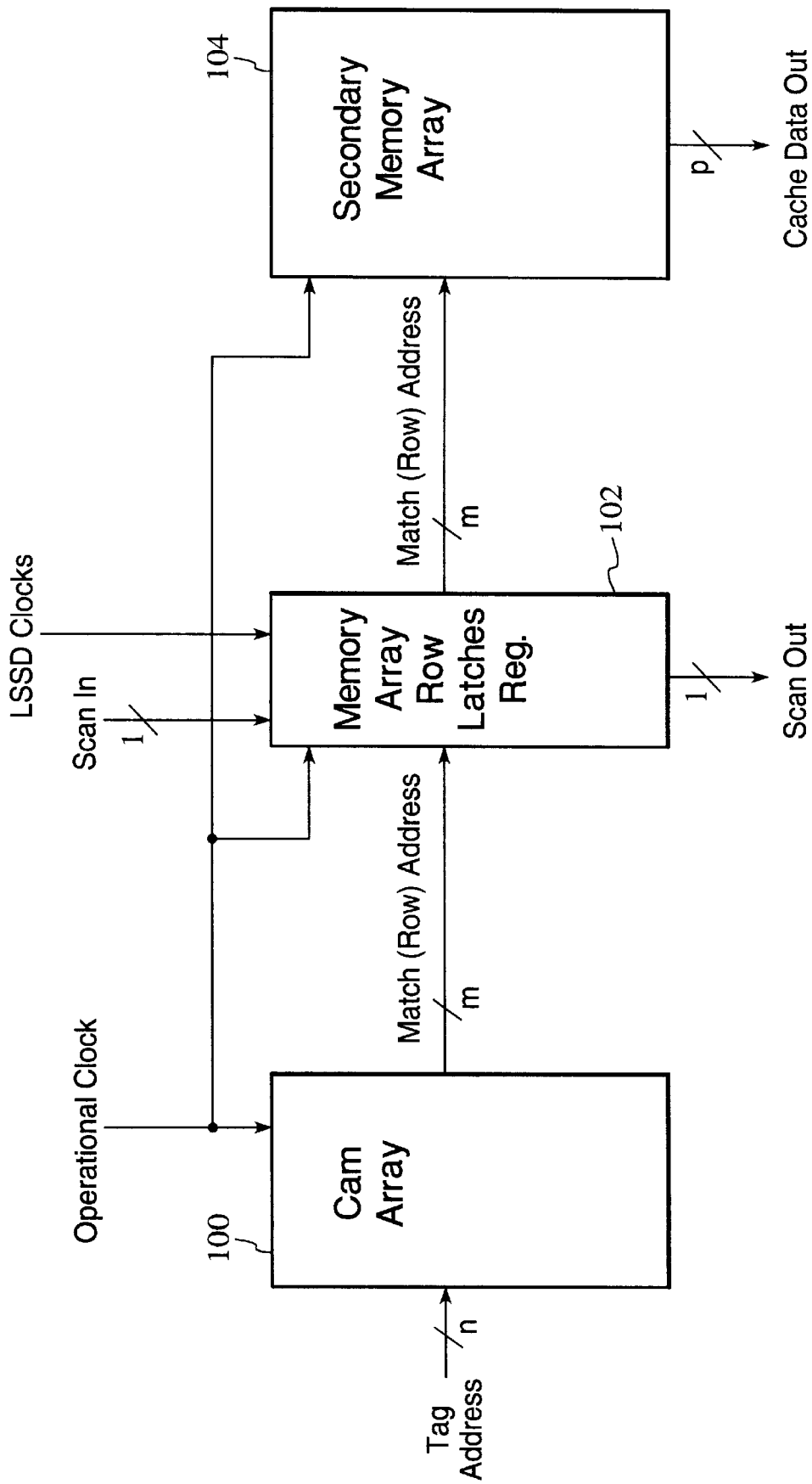
FIG. 1 is a block diagram of a conventional clocked content addressable memory and secondary memory architecture for determining a selected memory location.

FIG. 1 shows a block diagram of a conventional clocked CAM and secondary memory architecture which can determine selected memory locations. The block diagram of FIG. 1 includes a clocked CAM array 100 serially coupled to memory array row latches register 102, which in turn is serially coupled to a secondary memory array 104.

In standard clocked designs, scannable latches, such as those in the memory array row latches register 102, are easily inserted into the conventional clocked CAM 100 and secondary memory 104 architecture. The signals from the clocked CAM array 100 select rows of information in the secondary memory array 104, where the secondary memory array 104 is constructed as n rows by m columns. Each row represents a memory address, while each column represents a bit in the resulting memory word. A single pointer is typically utilized in the memory array row latches register 102 to identify selected memory locations of the secondary memory array 104. Thus, in clocked designs, each memory address (row) selected by the CAM architecture can be stored in a scannable latches register 102 across all the rows. Such a configuration is shown in FIG. 1.

From FIG. 1, it can be seen that by scanning the information from the row latches register 102, the actual secondary memory 104 location selected by the CAM 100 can be determined. Consequently, any failures (data mismatches) from the secondary memory 104 can be simply traced to the row selected in the array by observing the contents of the row latches register 102. This can be accomplished, for example, with a simple Level Sensitive Scan Design (LSSD) scan approach. The memory array row latches register 102 of FIG. 1 use, for example, simple LSSD scannable latches.

A problem caused by the latches register 102 is a loss of performance. Since the latches register 102 is serially coupled to the CAM array 100 and secondary memory array 104, the clocked cache architecture is noticeably delayed by the latches register 102.

Recently, self-timed cache designs are becoming more popular due to higher performance, lower power requirements, and other advantages associated with eliminating clock signals.

However, as previously discussed, in self-timed caches, there are no latches that can be inserted. That is, a latch typically maintains an assumed condition until it is reset by the next clock signal. Since there are no clock signals to reset a latch in a self-timed cache, the use of latches to determine the selected memory location is incompatible with self-timed caches. Instead, the CAM array produces an address which goes into the secondary memory array directly. Consequently, for self-timed caches, the selected location in the secondary memory is not stored and cannot be easily retained in any latching structure for later observation and analysis.

Figure 2:
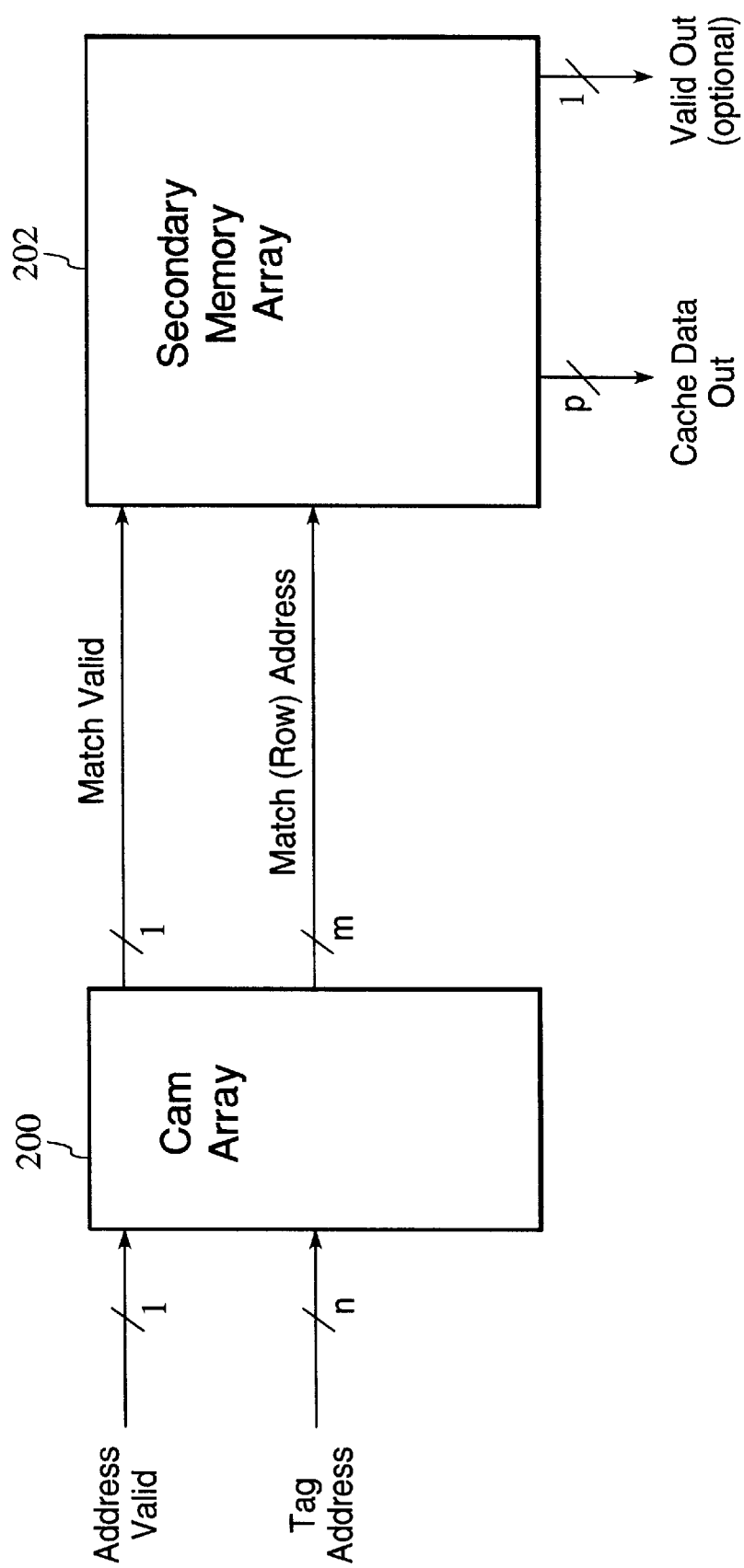
FIG. 2 is a block diagram of a conventional self-timed content addressable memory and secondary memory architecture for determining a selected memory location.

For example, consider the block diagram of FIG. 2 which shows a conventional, simplified, self-timed cache architecture. The diagram of FIG. 2 includes a CAM array 200 coupled to a secondary memory array 202.

In FIG. 2, the signal labeled as "valid" is a signal that indicates when the associated data bus(es) contains information. A complete discussion of the operation and function of these signals as well as their interaction between data buses can be found in U.S. Pat. No. 5,565,798 and U.S. Ser. No. 08/647,492, both assigned to the common assignee of the present application.

Note that in the architecture shown in FIG. 2, the signal labeled "Operational Clock" is no longer present. The lack of an "operational clock" signal implies that all timings are generated internally and no clock is routed to the CAM 200 or the Secondary Memory Array 202. Consequently, the memory array row latches register 102 of FIG. 1 are, then, non-existent. Consequently, a scanning function cannot be performed on the information coming from the CAM 200 and going into the Secondary Array 202, which further means that testing which, if any, of that array's memory locations is either severely hampered or non-existent.

Accordingly, what is needed is a method and system for determining which main memory array location has been accessed in a self-timed cache. The present invention addresses such a need.

The present invention provides a system and method for storing the memory address information which is the match address between the CAM and the secondary memory array into a register file. It preferably stores the matching address from either the last CAM/secondary memory operation or from the last "$2^x$" operations (where x is an integer), depending on the desired architecture/function.

An embodiment of the present invention uses a self-timed cache architecture coupled to a row identifier test circuit to store the row address information for the secondary memory array in a scannable register-file containing information for the last "$2^x$" accesses of the array. That is, in addition to the CAM Array, match address output information being sent to the secondary memory array, the information is also written in parallel into a register file that is preferably "m" entries wide by "$2^x$" entries deep, written short-handed as "$2^x$ by m". To aid in testability, this register file is preferably also LSSD scannable.

Figure 3:
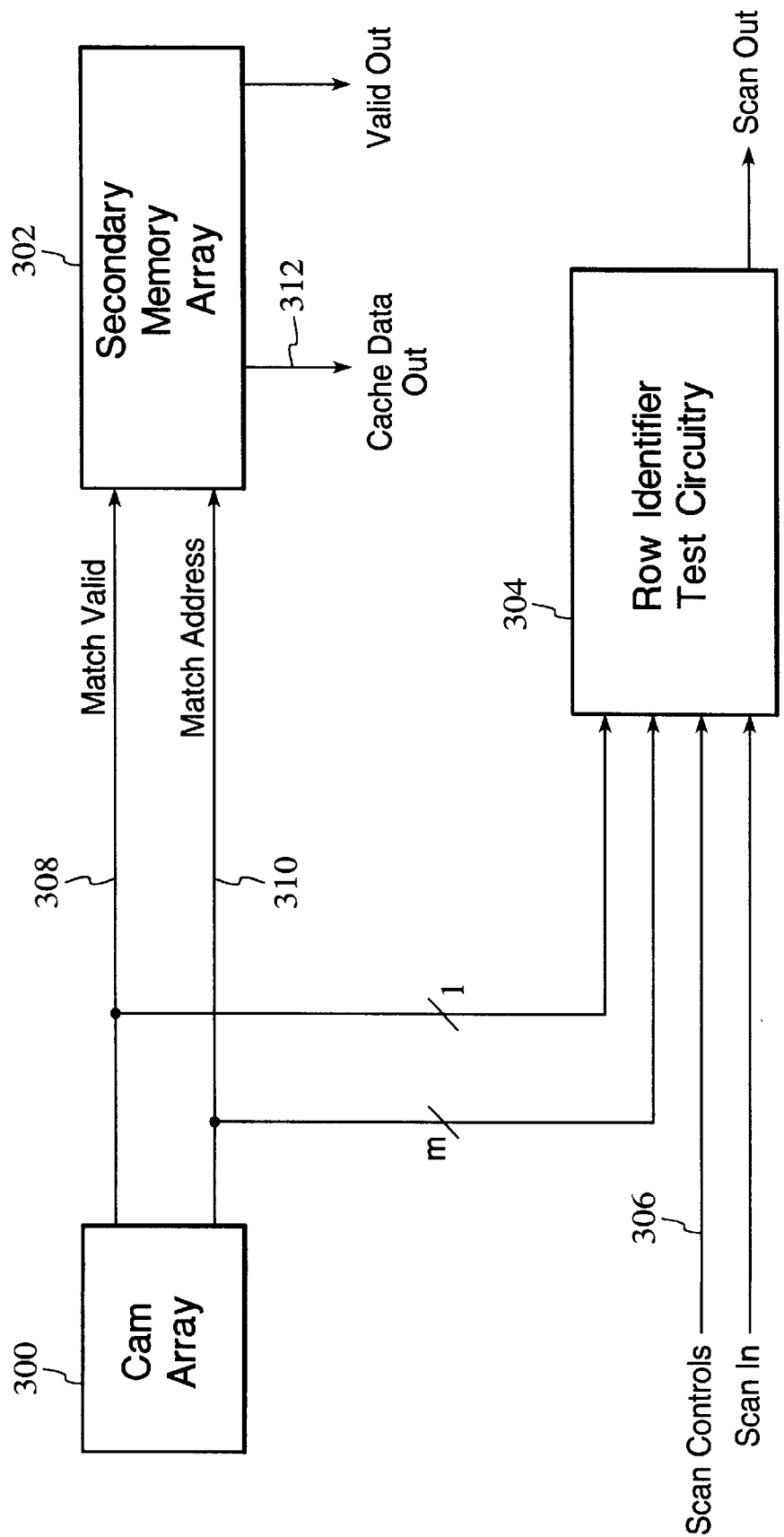
FIG. 3 is a block diagram of a system for determining which memory location has been accessed in a self-timed cache according to the present invention.

FIG. 3 is a block diagram of a system according to the present invention for a row identifier test circuitry for self-timed cache design. FIG. 3 includes a CAM array 300 which is coupled to a secondary memory array 302 and a row identifier test circuitry 304. A match address signal and a match valid signal are sent from the CAM array 300 to the secondary memory array 302. The match address signal indicates the secondary memory location (address) to be retrieved, while the match valid signal indicates that the match address signal is valid. Note in FIG. 3 that the circuit according to the present invention is coupled in parallel to the normal cache circuitry, minimally impacting performance.

Figure 4:
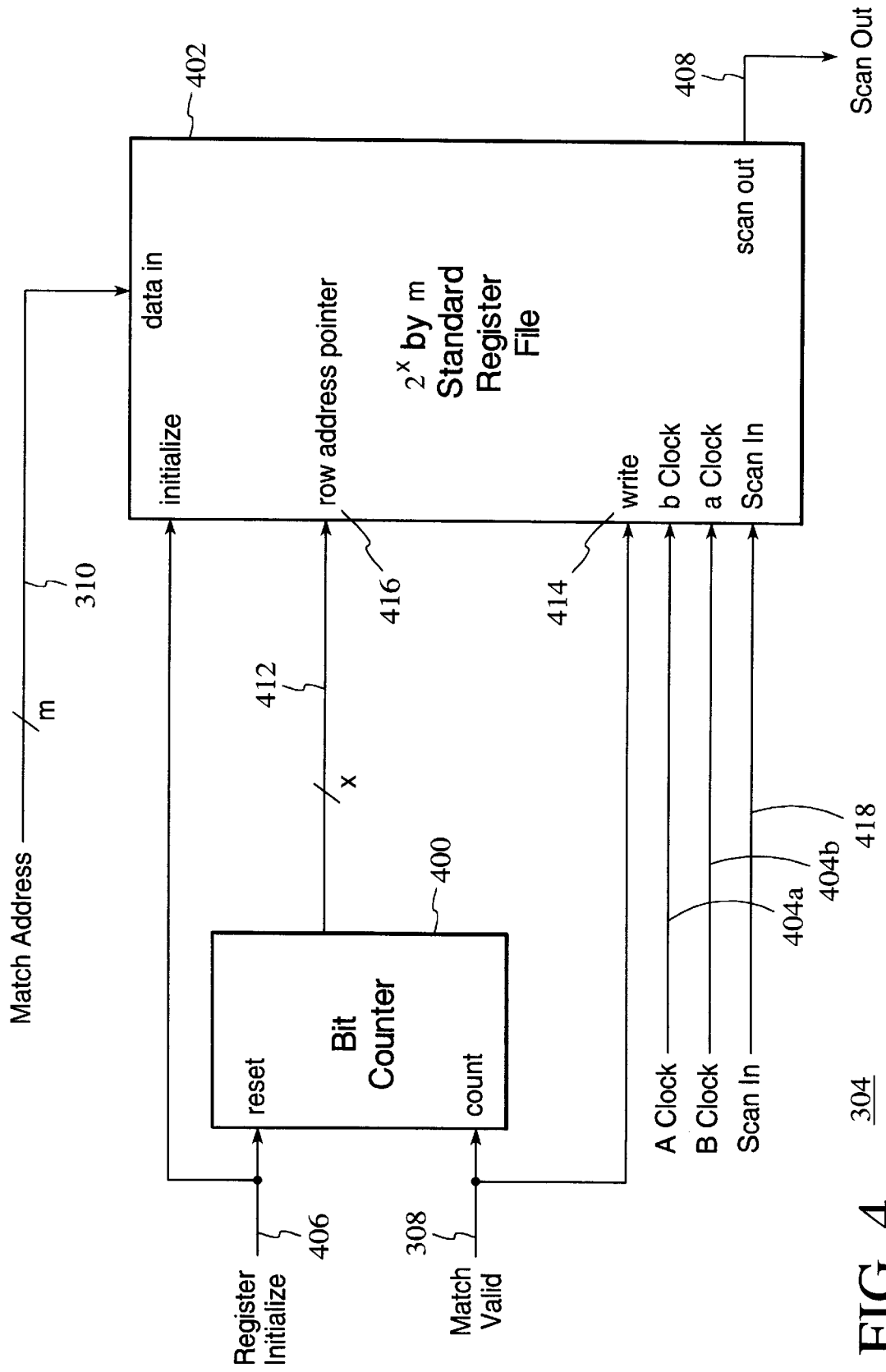
FIG. 4 is a block diagram of a row identifier test circuitry according to the present invention.

FIG. 4 is a block diagram showing the details of the row identifier test circuit 304 for the self-timed cache design of FIG. 3. The row identifier test circuitry 304 of FIG. 4 includes an x bit counter 400 coupled with a register file 402. The register file includes a plurality of registers. A register initialize signal 406 is received by both the bit counter 400 and the register file 402. The register initialize signal 406 is used to reset the power which resets the bit counter 400 to all zeros.

A match valid signal 308 is also received by the bit counter 400 and the register file 402. The match valid signal 308 indicates to the bit counter 400 to count. The match valid signal 308 also drives a write signal 414 in the register file 402. In response to match valid signal the bit counter 400 increments the count by one. The operation of the bit counter 400 is well known in the art. Additionally, match address 310 is the data in for the register file 402. The match address 310 signal is m bits wide.

The test circuit 304 also includes an A clock line and a B clock line. These lines are utilized to scan in and scan out signals which are used for test mode in an LSSD pattern.

As can be seen in FIG. 4, the bit counter 400 serves as the pointer to the next available register file address in the scannable register file 402 which is constructed as "$2^x$" rows by "m" columns. Initialization circuitry sets the bit counter 400 to the highest value. The use of multiple pointers permits the register file 402 to store the last "$2^x$" secondary memory array addresses as selected by the CAM Array 300 of FIG. 3. Consequently, these addresses can later be scanned out of the register file 402 as necessary. By storing $2^x$ accesses of the CAM Array 300, the system avoids the need to stop after every access to determine which memory location has been accessed for testing purposes.

Note also in FIG. 4, that the signals labeled as "A Clock" 404a, "B Clock" 404b, and "Register Initialize" 406 were previously described in FIG. 3 as "Scan Controls" 306.

Note in FIG. 4 that the usual "data out" port, associated with most register files, is not present. In this configuration, preferably, the only read function provided for the register file 402 is via the "Scan Out" signal 408 during scan operations. Note that a simple extension to this system could include a data out port (m bits wide) for use in other modes of operation.

The bit counter 400 of FIG. 4 is preferably a simple binary counter that produces an x-bit output using the "Match Valid" signal 308 to increment the counter output 412. Thus, a total of up to $2^x$ states can be represented by the bit counter 400.

The $2^x$ by m standard register file 402 of FIG. 4 is preferably designed using a simple decoder circuit and LSSD scannable memory cells. The decoder circuit determines the row address in the internal memory array from the bit counter output 412 and is preferably of standard design. The memory cell, likewise, is of a simple design using an LSSD scannable approach. Each of these components can be found in existing industry literature.

Note in FIG. 4 that the register file 402 uses the "Match Valid" signal 308 for the write enable signal 414 as well as to increment the counter 400. Additionally, the "Register Initialize" signal 406 is used to zero all entries in the register file 402.

In operation, a new CAM operation signals the secondary memory array 302 of FIG. 3 that new data is required by activating the "Match Valid" signal 308 and placing information of the "Match Address" bus 310. This function is performed and the new information is provided by the secondary memory 302 to the cache output 312.

The row identifier test circuitry 304 of FIG. 3 and FIG. 4 preferably performs its operations in parallel with the above-described operation. Referencing both FIG. 3 and FIG. 4, it can be seen that the match valid signal 308 causes the bit counter 400 to increment the count by 1 which in turn increments the "row address pointer" 416 in the register file 402. The register file 402 then uses the "Match Valid" signal 308 and the "row address pointer" 416 to write the "Match Address" information 310 into the nth memory location, as specified by the row address pointer 416. This stores the "Match Address" 310 in location n of the register file 402. In the next secondary memory array 302 access by the cache, the same operation occurs, and the next "Match Address" 310 is stored in the (n+1) location of the register file 402, thus loading the register file 402 with sequential locations. Each subsequent operation continues until the register file 402 is either full (has stored $2^x$ states) or a check of the information is desired. When the register file 402 is full, it simply writes over the existing information. Note that this operation in should not affect the normal cache operation or path.

Figure 5:
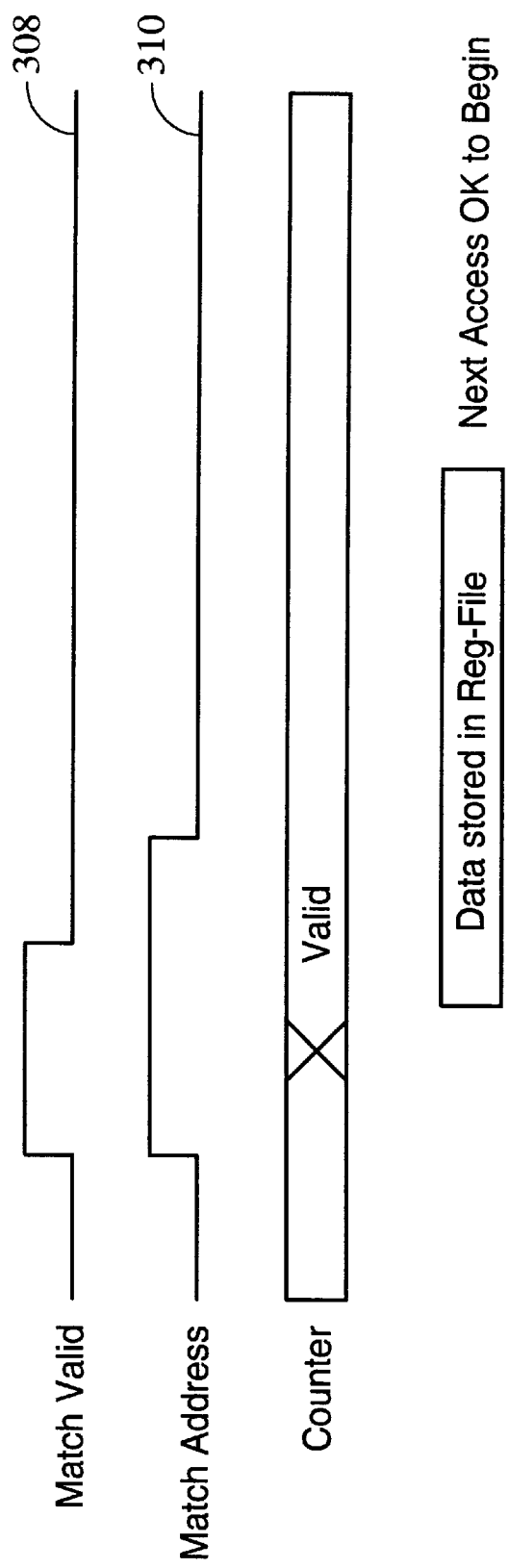
FIG. 5 is a timing diagram for the system and method according to the present invention.

FIG. 5 is a timing diagram corresponding to the system and method according to the present invention. When both the match valid signal 308 and the match address signal 310 are high, then the address can be read.

When the information stored in the row identifier test circuitry 304 of FIG. 3 and FIG. 4 is desired, the cache is taken off-line. Using the LSSD clocks ("A Clock" 404a and "B Clock" 404b) the information in the register file 402 is read out sequentially in what is referred to in the industry as a shift-register-latch approach. In this manner, all accessed memory locations (up to $2^x$) can easily be determined by utilizing well-known fault isolation and determination methods In FIG. 4, a "Scan In" signal 418 is also provided to facilitate the shift-register-latch approach to the register-file 402 design. That is, an input is necessary. However, it also adds the feature that the row identifier test circuitry 304 can, itself, be tested for manufacturing defects. This feature can be extremely important if proper diagnosis of any problems is required.

With regard to the "Match Address" 310 information, in a proper cache access, only a single bit in the m bit bus should be active. If not, then read/write contention in the secondary memory array 302 can occur, producing unpredictable results. By storing the selected addresses and utilizing LSSD techniques, it can be determined if such a contention occurred.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for determining which memory location has been accessed in a self-timed cache, the system comprising:

a content addressable memory included in the self-timed cache;

a secondary memory coupled to the content addressable memory and included in the self-timed cache, wherein the secondary memory includes a plurality of memory locations, wherein an access to the self-timed cache includes asserting an address, and wherein in response to a match between the asserted address and information in the content addressable memory a match valid line is asserted and a selected memory location of the plurality of selected memory locations is accessed; and test circuitry coupled to the content addressable memory, the test circuitry including a register file, wherein the register file stores a pointer which points to the selected memory location in response to the match valid line being asserted.

2. The system of claim 1, wherein the test circuitry includes a bit counter which increments a counter output.

3. The system of claim 1, wherein the register file is scannable.

4. The system of claim 3, wherein the register file is compatible with level sensitive scan design (LSSD).

5. The system of claim 1, wherein the register file contains $2^x$ memory locations selected by the content addressable memory, wherein x is an integer.

6. The system of claim 1 wherein the register file utilizes a plurality of pointers which point to a sequence of selected memory locations in response to the match valid line being asserted.

7. The system of claim 1, wherein the register file is constructed as $2^x$ rows by m columns.

8. The system of claim 1, wherein the test circuitry receives at least one signal sent from the content addressable memory to the secondary memory.

9. The system of claim 1, wherein the test circuitry is coupled to the content addressable memory in parallel with the secondary memory to provide an output of the content addressable memory to the test circuitry and the secondary memory.

10. The system of claim 1 wherein the plurality of memory locations have a plurality of addresses, wherein the access is one of a plurality of cache accesses; and wherein the register file includes a plurality of register memory locations, each register memory location of a portion of the plurality of register memory locations storing an address of a portion of the plurality of addresses for each of the plurality accesses.

11. A method for determining which memory location has been accessed in a self-timed cache, the cache including a content addressable memory coupled to a secondary memory including a plurality of memory locations, the method comprising the steps of:

(a) in response to a match between an asserted address asserted for an access of the self-timed cache and information in the content addressable memory included in the self-timed cache, asserting a match valid line and accessing a selected memory location in the secondary memory included in the self-timed cache; and (b) storing the selected memory location in a test circuitry coupled with the content addressable memory in response to the match valid line being asserted, the test circuitry including a register file for storing the selected memory location.

12. The method of claim 11, further comprising the step of:

(c) scanning the test circuitry.

13. The method of claim 12, wherein the step of scanning is compatible with level sensitive scan design (LSSD).

14. The method of claim 11 wherein the test circuitry is coupled to the content addressable memory in parallel with the secondary memory to provide an output of the content addressable memory to the test circuitry and the secondary memory.

15. The method of claim 11 wherein the plurality of memory locations have a plurality of addresses, wherein the access is one of a plurality of accesses; and wherein the register file includes a plurality of register memory locations, each register memory location of a portion of the plurality of register memory locations storing an address of a portion of the plurality of addresses for each of the plurality of accesses.

* * * * *